(12) United States Patent
Choi

(10) Patent No.: US 6,803,311 B2
(45) Date of Patent: Oct. 12, 2004

(54) METHOD FOR FORMING METAL FILMS

(75) Inventor: Eun-Seok Choi, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 15 days.

(21) Appl. No.: 10/329,522

(22) Filed: Dec. 27, 2002

(65) Prior Publication Data

US 2004/0053496 A1 Mar. 18, 2004

(30) Foreign Application Priority Data

Sep. 17, 2002 (KR) .................................. 10-2002-56460

(51) Int. Cl.⁷ .............................................. H01L 21/44
(52) U.S. Cl. ....................... 438/674; 438/676; 438/677; 438/686
(58) Field of Search ......................... 438/674, 676–677, 438/686

(56) References Cited

U.S. PATENT DOCUMENTS

| 5,744,832 | A | 4/1998 | Wolters et al. |
|---|---|---|---|
| 6,015,989 | A | 1/2000 | Horikawa et al. |
| 6,140,173 | A | 10/2000 | Wolters et al. |
| 2002/0153101 | A1 * | 10/2002 | Nguyen et al. ........ 156/345.28 |
| 2002/0182385 | A1 * | 12/2002 | Senkevich et al. .......... 428/209 |
| 2002/0192509 | A1 * | 12/2002 | Basceri et al. .............. 428/702 |
| 2003/0003730 | A1 * | 1/2003 | Li .............................. 438/686 |

FOREIGN PATENT DOCUMENTS

WO   WO 200243114 A   * 11/2001

* cited by examiner

*Primary Examiner*—Lynne A. Gurley
(74) *Attorney, Agent, or Firm*—Jacobson Holman PLLC

(57) ABSTRACT

A method for forming a metal thin film is suitable for suppressing the deterioration of a throughput according to enlarging a purge time to prevent the metal precursor from mixing with a reaction gas in a reactor during the deposition of an atomic layer. The method includes the steps of flowing a reaction gas into a reactor loaded therein a substrate, flowing a metal precursor in a pulse form into the reactor, activating the reaction gas by exiting a plasma in a pulse form to change with a pulse of the metal precursor in the reactor, alternately and depositing a metal thin film in a unit of an atomic layer by reacting the activated reaction gas with the metal precursor.

15 Claims, 6 Drawing Sheets

METHOD FOR FORMING METAL FILMS

FIELD OF THE INVENTION

The present invention relates to a semiconductor memory device; and, more particularly, to a method for forming noble metal electrodes.

DESCRIPTION OF RELATED ART

Recently, an oxidation layer including a noble metal such as platinum(Pt), iridium(Ir), ruthenium(Ru), iridium oxidation layer(IrO), ruthenium oxidation layer(RuO), Pt-alloy or the like has been employed as a top/bottom electrode to increase a capacitance of a capacitor.

A chemical vapor deposition(CVD) or an atomic layer deposition(ALD) having an improved step coverage in comparison with a physical vapor deposition(PVD) must be employed to utilize a noble metal as a capacitor electrode of a high density memory device.

Referring to FIG. 1, there is shown a diagram representing a supply of gas for a CVD of a noble metal in accordance with a conventional method. The drawing represents a reaction gas, a base gas and a noble metal precursor flowing into a reactor during the operation of the CVD.

Referring to FIG. 1, the noble metal precursor and the reaction gas are continuously injected into the reactor during a deposition process for depositing a noble metal thin film.

However, in the CVD, to react the noble metal precursor with the reaction gas sufficiently, it is necessary to increase a temperature of a substrate to be deposited thereon the noble metal thin film; accordingly this means that the CVD must be implemented at a high temperature.

Therefore, a roughness of a surface of the noble metal thin film is increased; and particularly, there is a problem of an agglomeration effect during a thermal process due to a deterioration of the thin film density. And also, a throughput is decreased since a deposition speed is reduced for securing sufficient step coverage.

An ALD has been introduced in order to overcome the above-described shortcomings of the CVD.

Referring to FIG. 2, there is shown a diagram representing a supply of gas for the ALD of a noble metal in accordance with a conventional method. The drawing represents a noble metal precursor flowing into a reactor, a reaction gas and a base gas during the operation of the CVD.

Referring to FIG. 2, a reaction gas and a noble metal precursor flowing into a reactor follow to a pulse type supplying method, which is one of special features of the ALD.

But, in the ALD, a combination between the noble metal precursor and the reaction gas or a condition is selected to obtain a sufficient reactivity; and further, since an advantage of the ALD does not implement if the noble metal precursor and the reaction gas are mixed in a vapor phase, it is necessary to insert a purge time between flowing pulses of the noble metal precursor and the reaction gas, as a result, there is a limit in throughput.

Accordingly, since there does not exist an appropriate gas substituted for the noble metal precursor, a possibility of realization is low, and although the appropriate gas is detected, a throughput becomes low since the purge time between flowing pulses of the noble metal precursor and the reaction gas becomes long to mix with the noble metal precursor and the reaction gas.

SUMMARY OF THE INVENTION

It is, therefore, an object of the present invention to solve the above-described problems of the conventional method and to provide a method for forming a noble metal thin film suitable for suppressing the deterioration of a throughput according to enlarging a purge time to prevent the noble metal precursor from mixing with a reaction gas in a reactor during the deposition of an atomic layer.

In accordance with one aspect of the present invention, there is provided a method for forming a metal thin film, the method including the steps of: flowing a reaction gas into a reactor loaded therein a substrate; flowing a metal precursor in a pulse form into the reactor; activating the reaction gas by exciting a plasma in a pulse form to change with a pulse of the metal precursor in the reactor, alternately; and depositing a metal thin film in a unit of an atomic layer by reacting the activated reaction gas with the metal precursor.

In accordance with another aspect of the present invention, there is provided a method for forming a metal thin film, the method including the steps of: loading a substrate in a reactor; flowing a reaction gas and a base gas into the reactor; supplying a metal precursor solved in an organic solvent in a form of a pulse into the reactor; activating the reaction gas by exciting a plasma in a pulse form to change with a pulse of the metal precursor in the reactor, alternately; and depositing a metal thin film in a unit of an atomic layer by reacting the activated reaction gas with the metal precursor.

In accordance with another aspect of the present invention, there is provided a method for forming a metal thin film, wherein the deposition method is implemented by alternately repeating a pulse to inflow the metal precursor and a pulse to excite the plasma and the reaction gas is continuously introduced during the repetitions of the pulse to inflow the metal precursor and the pulse to excite the plasma.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, a preferred embodiment of the present invention will be described in detail referring to the accompanying drawings.

Figure 1:
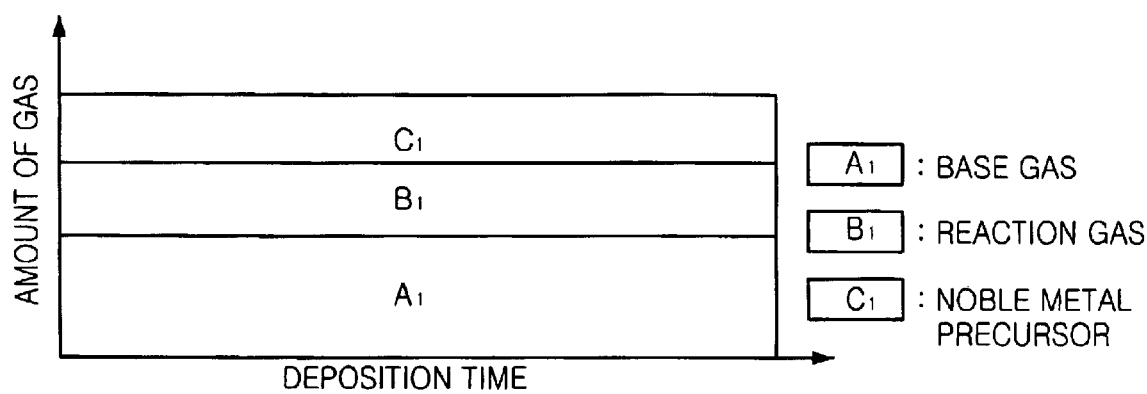
FIG. 1 is a diagram showing a gas supply of a chemical vapor deposition(CVD) of a noble metal in accordance with a conventional method.
Figure 2:
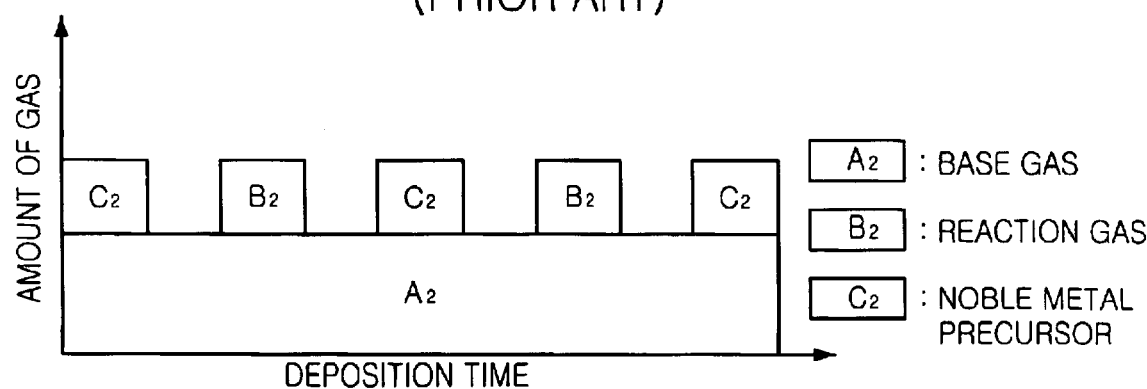
FIG. 2 shows a diagram representing a gas supply of an atomic layer deposition(ALD) of a noble metal in accordance with a conventional method.
Figure 3:
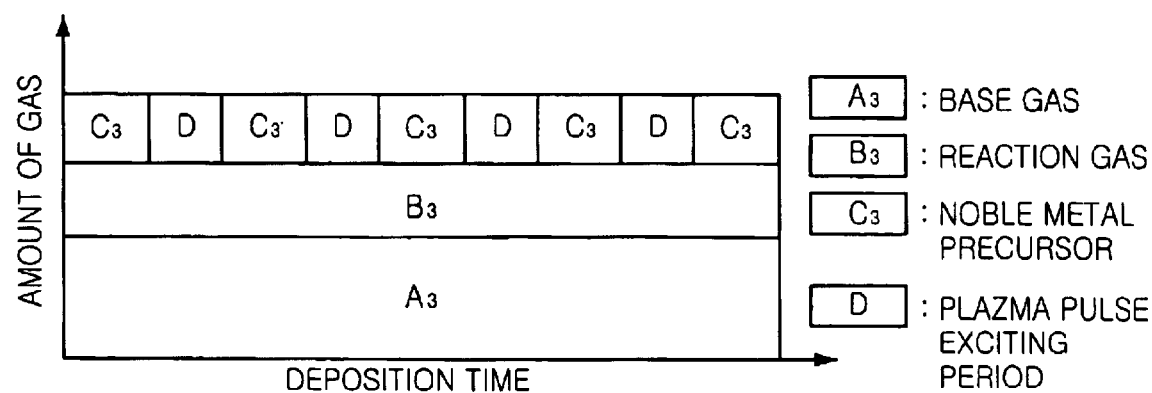
FIG. 3 illustrates a drawing depicting a gas supply of a method for forming a noble metal thin film in accordance with a first preferred embodiment of the present invention.

Referring to FIG. 3, there is shown a drawing depicting a gas supply of a method for forming a noble metal thin film in accordance with a first preferred embodiment of the present invention. The drawing represents a reaction gas, a base gas and a noble metal precursor flowing into a reactor 5 during the operation of the CVD.

Referring to FIG. 3, the base gas and the reaction gas are continuously injected into a reactor during the deposition process, and there exists only pulses to supply a noble metal precursor. That is, pulses to supply the reaction gas do not exist and pulses to excite plasma are inserted between the pulses to supply the noble metal precursor.

The deposition of the noble metal thin film in according to FIG. 3 utilizes a purge gas containing an reaction gas as the base gas, after inserting the noble metal precursor into the reactor, the noble metal thin film is deposited by activating the reaction gas by exciting the plasma in the reactor.

Therefore, the deposition method of the noble metal thin film in according to FIG. 3 allows a disturbance in the reactor to be reduced drastically in comparison with an atomic layer deposition(ALD) method to alternately insert the noble metal precursor and the reaction gas.

Figure 4:
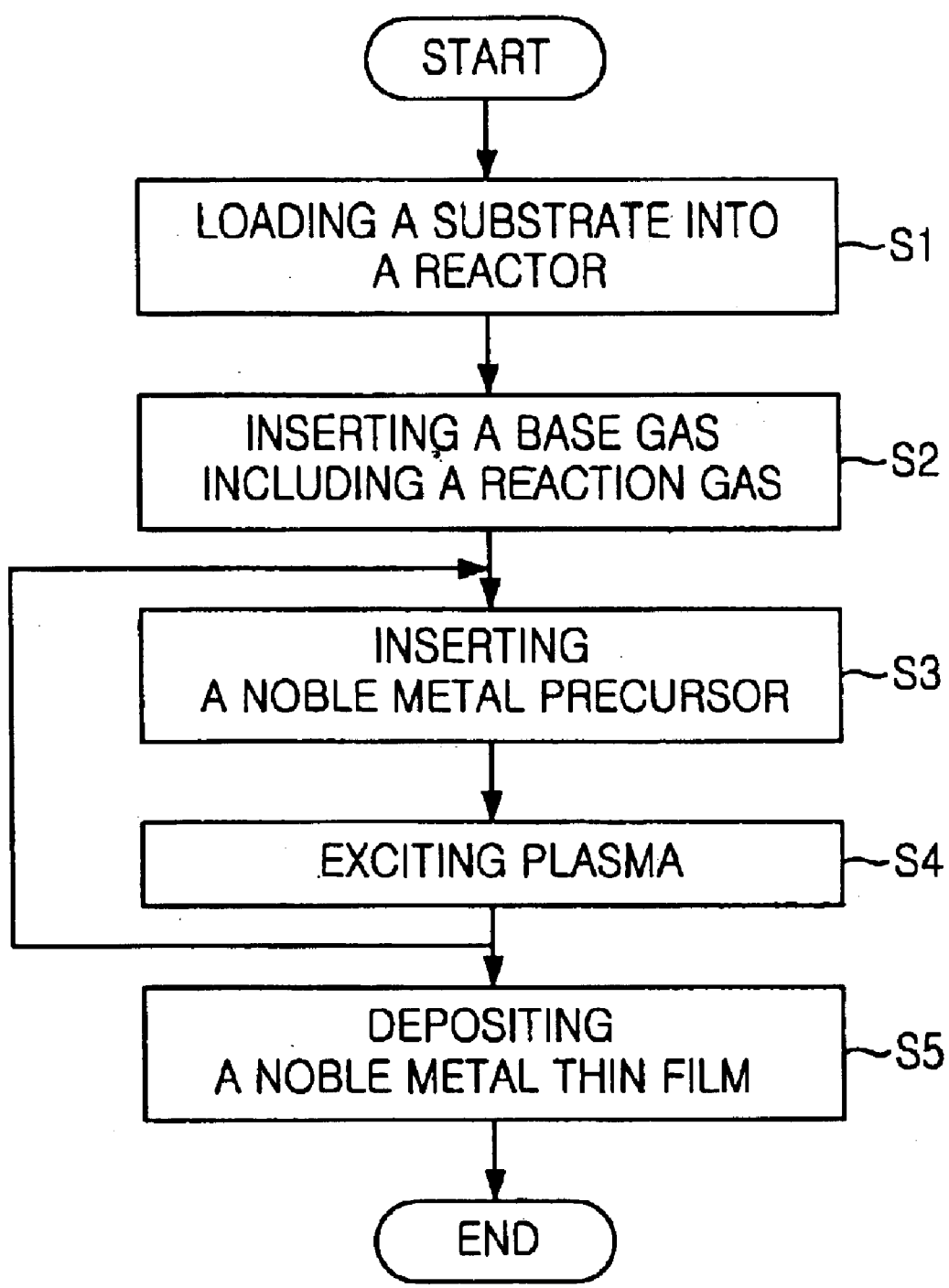
FIG. 4 is a flow chart presenting the method for forming the noble metal thin film in accordance with the first preferred embodiment of the present invention.

FIG. 4 is a flow chart presenting the method for forming the noble metal thin film in accordance with the first preferred embodiment of the present invention.

As shown in FIG. 4, after a substrate, on which the noble metal thin film is loaded into the reactor(S1), a base gas containing the reaction gas flows into the reactor(S2). At this time, a constantly mixed gas of the reaction gas and the base gas is injected, wherein the base gas flows at a constant flow rate into the reactor by being mixed with the reaction gas or a reaction source material. An inert gas for use as a purge gas is utilized as the base gas. Therefore, the base gas is a purge gas containing a reaction gas.

In the next step, after the noble metal precursor is injected in the form of pulse into the reactor which the base gas and the reaction gas are injected into (S3), the plasma is excited in the reactor(S4). Accordingly, the plasma of the reaction gas, which is previously provided into the reactor, is excited by providing pulses between periods of providing pulses of the noble metal precursors.

In the following step, by repeating the process(S3) for inserting the noble metal precursor and the process(S4) for exciting the plasma, the noble metal thin film in the level of atomic layer is deposited on the substrate by reacting the noble metal precursor with the reaction gas through the previously inserted plasma excitation(S5).

Finally, the noble metal thin film is deposited by reacting the noble metal precursor with the reaction gas by using the plasma at a temperature range which does not react the noble metal precursor with the reaction gas, therefore, a throughput as a shortcoming of the ALD method can be improved.

A deposition temperature is ranging from a room temperature to 700° C., a power is applied in a range from 10 W to 1000 w, the inert gas is selected from an inert gas such as He, Ne, Xe, Kr, Ar, $N_2$ or the like, the reaction gas is selected from one among a group consisting of $O_2$, $H_2$, $NH_3$ and $N_2O$ or combines two selected from the group consisting of $O_2$, $H_2$, $NH_3$ and $N_2O$ and a flow rate thereof is ranged from 10 sccm to 10000 sccm.

And, when platinum(Pt) is deposited as the noble metal precursor, $(COD)Pt(CH_3)_3$, $(COD)Pt(CH_3)(Cp)$, $(COD)Pt(CH_3)Cl$, $(Cp)Pt(CH_3)(CO)$, $(Cp)Pt(allyl)$, $(Cp)Pt(CH_3)_3$, $(MeCp)Pt(CH_3)_3$, $(acac)Pt(CH_3)_3$, $Pt(acac)_2$, $Pt(CH_3)_2(CH_3)NC$, $Pt(HFA)_2$, $Pt(hfac)_2$, $Pt(tmhd)_2$ are utilized. And also, when a ruthenium layer is deposited, $Ru(Cp)_2$, $Ru(MeCp)_2$, $Ru(EtCp)_2$, $Ru(tmhd)_3$, $Ru(od)_3$ are utilized, when an iridium layer is deposited, $(MeCp)Ir(COD)$, $(EtCp)Ir(COD)$, $(Cp)Ir(COD)$, $(hfac)Ir(COD)$, $Ir(acac)_3$, $(acac)Ir(COD)$, $(COD)Ir(\mu\text{-}OAc)$, $(COD)Ir(\mu\text{-}OCH_3)_2$, $Ir(allyl)_3$, iridium halide, $Ir(hfa)_2$, $Ir(hfac)_2$, $Ir(tmhd)_2$ are utilized.

As utilizing the above-described precursors, these precursors may be utilized by solving in an organic solvent. It is preferably that the organic solvent can be selected from a group consisting of tetrahydrofuran(THF), n-butylacetate, hexane, cyclohexane, toluene, xylene and benzene.

And then, when the pulses to excite the plasma are inserted between the inserting pulses of the noble metal precursors, a time period is ranging from 0 to 60 seconds, and the pulse to excite the plasma and the pulse of the noble metal precursor are ranged from 0.001 to 60 seconds, respectively. Here, as the time of the pulse to excite the plasma is increased, a deposition time becomes long based on the increased amount, which will, in turn, deteriorate a throughput thereof; therefore, it is preferable that the process is performed by a possible short time.

Comparing the deposition method of the noble metal thin film of FIG. 4 with a conventional atomic layer deposition (ALD) method, in the conventional ALD, the noble metal precursor and the reaction gas are supplied alternately and a purge process is inserted to prevent the noble metal precursor from mixing with the reaction gas, whereas the present invention utilizes only the pulse to supply the noble metal precursor and omits the purge process.

Therefore, it is not to alternately insert the noble metal precursor and the reaction gas and it is not to be required to purge between the noble metal precursor and the reaction gas. And also, it is possible to deposit at a low temperature since the method employs plasma energy; as a result, a surface roughness is drastically reduced, and a generation of impurity is completely suppressed in the thin film by appropriately selecting the reaction gas of the plasma. Also, the step coverage is excellent because a mechanism of ALD to supply the noble metal precursor in a pulse form is utilized.

Figure 5:
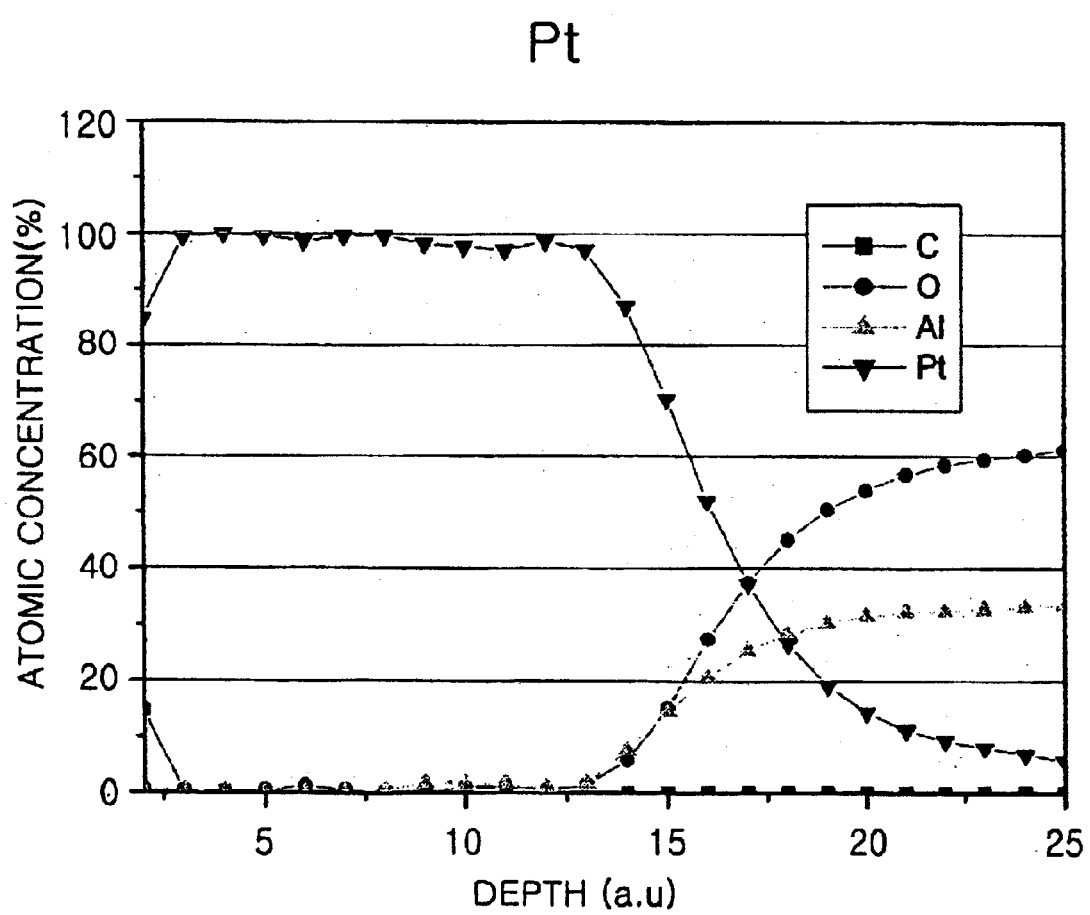
FIG. 5 is a graph showing a distribution of atoms in a platinum(Pt) layer in accordance with a preferred embodiment of the present invention.

FIG. 5 is a graph showing a distribution of atoms in a platinum(Pt) layer in accordance with a preferred embodiment of the present invention, wherein the result is obtained at a temperature of 200° C. by utilizing $MeCpPt(Me)_3$ as a precursor and $O_2$ as a reaction gas.

Figure 6:
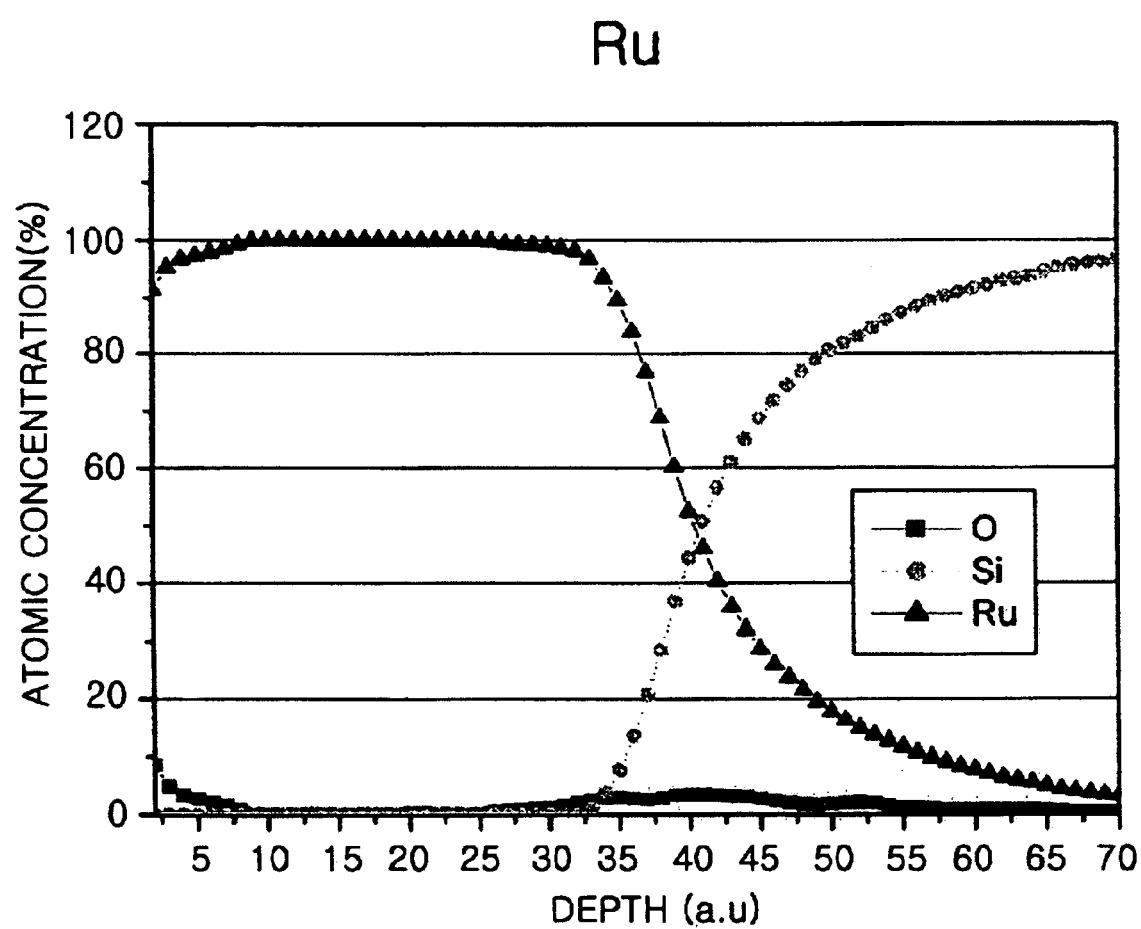
FIG. 6 is a graph showing a distribution of atoms in a ruthenium(Ru) layer in accordance with a preferred embodiment of the present invention.

FIG. 6 is a graph showing a distribution of atoms in a ruthenium(Ru) layer in accordance with a preferred embodiment of the present invention, wherein the result is obtained at a temperature of 350° C. by utilizing $Ru(EtCp)_2$ as a precursor and $O_2$ as a reaction gas.

Referring to FIG. 5 and FIG. 6, there are shown carbon or oxygen remained in the platinum layer and the ruthenium layer scarcely.

If the noble metal thin film according to FIG. 4 is applied to a capacitor of a high-density memory device, a surface roughness improvement, a suppression of impurity in the thin film and excellent step coverage are obtained to thereby improve electrical characteristics of the capacitor.

Figure 7A:
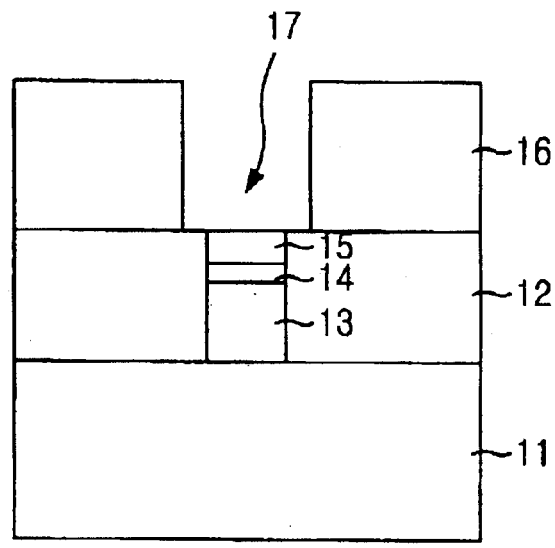
FIGS. 7A to 7C are cross-sectional diagrams showing a method for manufacturing a capacitor in accordance with a preferred embodiment of the present invention.
Figure 7B:
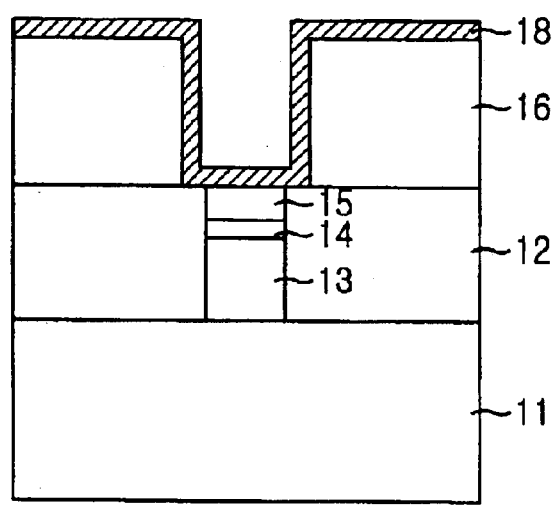
Figure 7C:
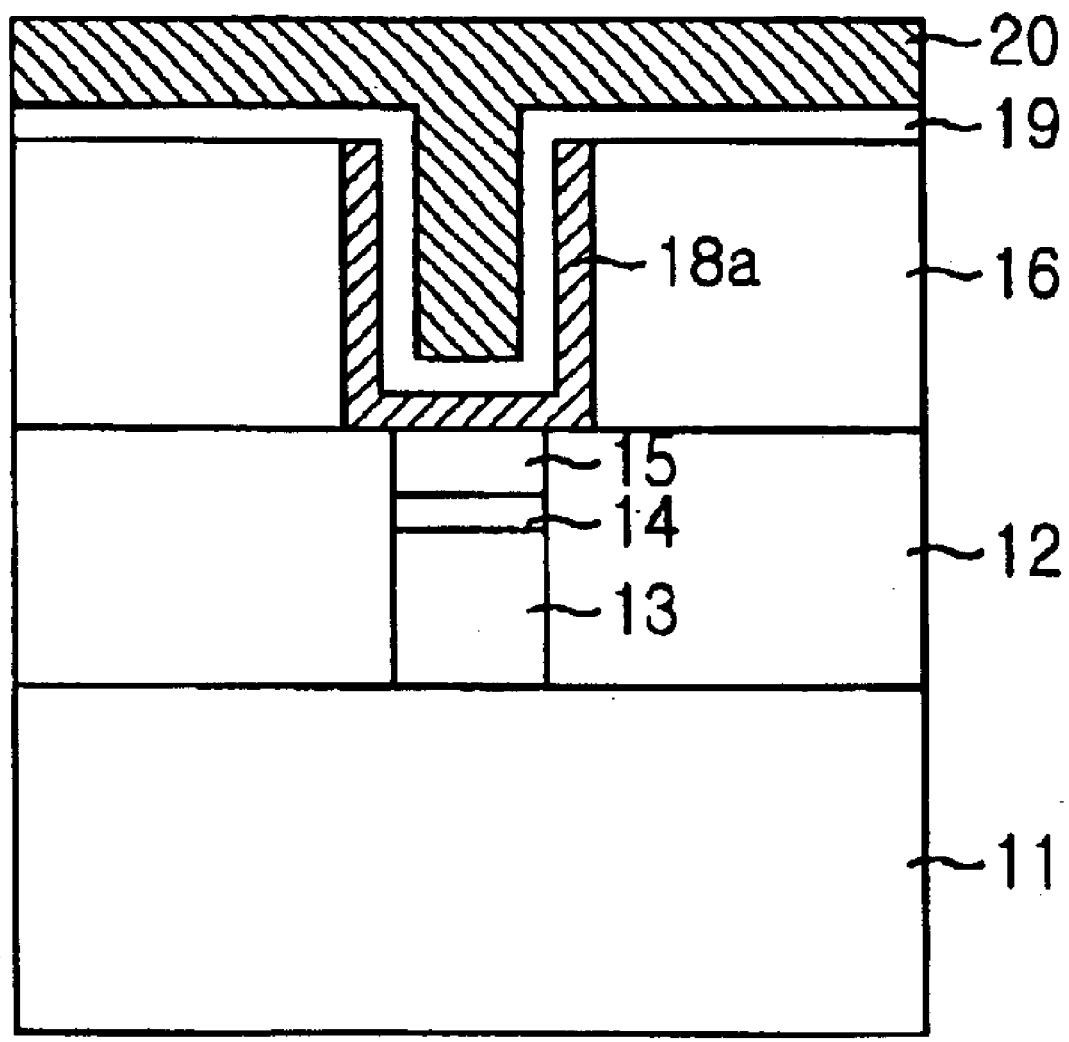

FIGS. 7A to 7C are cross-sectional diagrams showing a method for manufacturing a capacitor in accordance with a preferred embodiment of the present invention, wherein the capacitor includes a plug structure.

As shown in FIG. 7A, after an inter layer dielectric layer 12 is formed on a semiconductor substrate 11 finished manufacturing process of a transistor and a bit line(not shown), a storage node contact hole is formed in such a way that a predetermined portion of surface of the semiconductor substrate 11 is exposed by etching the inter layer dielectric layer 12 by using a photoresist layer as a contact mask. Consequently, after a polysilicon is formed on an entire surface including the storage node contact hole, a polysilicon plug 13 is partially buried in the storage node contact hole through an etch back or a chemical vapor deposition (CMP) process.

Subsequently, after a titanium silicide 14 is formed on the polysilicon plug 13 to improve a contact resistance between the polysilicon plug and a bottom electrode, a titanium nitride 15 is formed as a diffusion barrier to prevent oxygen from diffusing from the bottom electrode on the titanium silicide 14 to the polysilicon plug 13.

At this time, the titanium silicide 14 is formed by a thermal treatment after the deposition of the titanium, the titanium nitride 15 is completely buried on a storage node contact hole through an etch back or a CMP process and a stack structure including the polysilicon 13, the titanium silicide 14 and the titanium nitride 15 which are buried in the storage node contact hole is typically called as a storage node contact(SNC).

In an ensuing step, after a capacitor oxidation layer 16 formed on the inter layer dielectric layer 12 including the titanium nitride 15 to determine a height of the bottom electrode, a predetermined region to be formed the bottom electrode(conventionally called as a concave pattern and referred as a concave pattern hereinafter) is opened by etching the capacitor oxidation layer 16 with a storage node mask(not shown).

As shown in FIG. 7B, a platinum layer 18 is deposited on the capacitor oxidation layer 16 including the opened concave pattern 17 as a bottom electrode in according to the processes shown in FIG. 4.

At this time, $(COD)Pt(CH_3)_3$, $(COD)Pt(CH_3)(Cp)$, $(COD)Pt(CH_3)Cl$, $(Cp)Pt(CH_3)(CO)$, $(Cp)Pt(allyl)$, $(Cp)Pt(CH_3)_3$, $(MeCp)Pt(CH_3)_3$, $(acac)Pt(CH_3)_3$, $Pt(acac)_2$, $Pt(CH_3)_2(CH_3)NC$, $Pt(HFA)_2$, $Pt(hfac)_2$, and $Pt(tmhd)_2$ are utilized as a precursor during the deposition of the platinum layer 18.

On the other hand, when a ruthenium layer is deposited as a bottom electrode, $Ru(Cp)_2$, $Ru(MeCp)_2$, $Ru(EtCp)_2$, $Ru(tmhd)_3$, and $Ru(od)_3$ are utilized. Whereas when an iridium layer is deposited as a bottom electrode, $(MeCp)Ir(COD)$, $(EtCp)Ir(COD)$, $(Cp)Ir(COD)$, $(hfac)Ir(COD)$, $Ir(acac)_3$, $(acac)Ir(COD)$, $(COD)Ir(\mu\text{-}OAc)$, $(COD)Ir(\mu\text{-}OCH_3)_2$, $Ir(allyl)_3$, iridium halide, $Ir(hfa)_2$, $Ir(hfac)_2$, and $Ir(tmhd)_2$ are utilized.

The above-described precursor can be used with solving in an organic solvent. It is preferable that the organic solvent is selected from a group consisting of tetrahydrofuran (THF), n-butylacetate, hexane, cyclohexane, toluene, xylene and benzene.

Since the platinum layer is deposited at a low temperature, the titanium nitride consisting of the storage node contact is prevented, thereby obtaining an excellent step coverage and easily depositing a following dielectric layer.

As shown in FIG. 7C, a platinum bottom electrode 18a isolated from adjacent cells by remaining the platinum layer 18 only in the concave pattern 17, a dielectric layer 19 such as BLT, $Ta_2O_5$, SBT, SBTN is deposited on the platinum bottom electrode 18a and an upper electrode 20 such as a platinum layer and an iridium layer is formed subsequently. For example, if the platinum layer is deposited as the upper electrode 20, the deposition method according to FIG. 4 is further advantageous because a bottom structure becomes further fine.

The platinum layer in accordance with the preferred embodiment of the present invention can be applicable to a bottom electrode of a cylindrical, a concave or a stack type capacitor or a part of the bottom electrode, and it is also applicable to an upper electrode of this various structure or a part of the upper electrode.

The above-described invention has an effect in securing a deposition method of a noble metal thin film having an excellent surface roughness and step coverage. And, it can secure a deposition method of a high density and purity of noble metal thin film as well as obtain a deposition method of a noble metal thin film having a high productivity at the same time.

While the present invention has been described with respect to the particular embodiments, it will be apparent to those skilled in the art that various changes and modifications may be made without departing from the spirit and scope of the invention as defined in the following claims.

What is claimed is:

1. A method for forming a metal thin film, the method comprises the steps of:

continuously flowing a reaction gas and a base gas at the same time into a reactor in which a substrate is loaded, wherein the base gas is an inert gas;

flowing a metal precursor in a pulse form into the reactor;

activating the reaction gas by exciting a plasma in a pulse form to be alternated with a pulse of the metal precursor in the reactor; and depositing a metal thin film in a unit of an atomic layer by reacting the activated reaction gas with the metal precursor.

2. The method of claim 1, wherein the deposition method is implemented by alternately repeating a pulse to inflow the metal precursor and a pulse to excite the plasma.

3. The method of claim 2, wherein a time interval between the pulse to inflow the metal precursor and the pulse to excite the plasma is approximately between 0 to 60 seconds.

4. The method of claim 2, wherein a time period of the pulse to inflow the metal precursor and a time period of the pulse to excite the plasma are approximately between 0.001 to 60 seconds, respectively.

5. The method of claim 2, wherein the reaction gas is continuously introduced during the repetitions of the pulse to inflow the metal precursor and the pulse to excite the plasma.

6. The method of claim 1, wherein the precursor is selected from a group consisting of $(COD)Pt(CH_3)_3$, $(COD)Pt(CH_3)(Cp)$, $(COD)Pt(CH_3)Cl$, $(Cp)Pt(CH_3)(CO)$, $(Cp)Pt(allyl)$, $(Cp)Pt(CH_3)_3$, $(MeCp)Pt(CH_3)_3$, $(acac)Pt(CH_3)_3$, $Pt(acac)_2$, $Pt(CH_3)_2(CH_3)NC$, $Pt(HFA)_2$, $Pt(hfac)_2$, $Pt(tmhd)_2$, $Ru(Cp)_2$, $Ru(MeCp)_2$, $Ru(EtCp)_2$, $Ru(tmhd)_3$, $Ru(od)_3$, $(MeCp)Ir(COD)$, $(EtCp)Ir(COD)$, $(Cp)Ir(COD)$, $(hfac)Ir(COD)$, $Ir(acac)_3$, $(acac)Ir(COD)$, $(COD)Ir(\mu\text{-}OAc)$, $(COD)Ir(\mu\text{-}OCH_3)_2$, $Ir(allyl)_3$, iridium halide, $Ir(hfa)_2$, $Ir(hfac)_2$ and $Ir(tmhd)_2$.

7. The method of claim 1, wherein the reaction gas is selected from a group consisting of $O_2$, $H_2$, $NH_3$ and $N_2O$.

8. A method for forming a metal thin film, the method comprises the steps of:

loading a substrate in a reactor;

continuously flowing a reaction gas and a base gas into the reactor at the same time, wherein the base gas is an inert gas;

supplying a metal precursor solved in an organic solvent in a form of a pulse into the reactor;

activating the reaction gas by exciting a plasma in a pulse form to be alternated with a pulse of the metal precursor in the reactor; and depositing a metal thin film in a unit of an atomic layer by reacting the activated reaction gas with the metal precursor.

9. The method of claim 8, wherein the deposition method is implemented by alternately repeating a pulse to inflow the metal precursor and a pulse to excite the plasma.

10. The method of claim 9, wherein a time interval between the pulse to inflow the metal precursor and the pulse to excite the plasma is approximately between 0 to 60 seconds.

11. The method of claim 9, wherein a time period of the pulse to inflow the metal precursor and a time period of the pulse to excite the plasma are approximately between 0.001 to 60 seconds, respectively.

12. The method of claim 9, wherein the reaction gas is continuously introduced during the repetitions of the pulse to inflow the metal precursor and the pulse to excite the plasma.

13. The method of claim 8, wherein the precursor is selected from a group consisting of $(COD)Pt(CH_3)_3$, $(COD)Pt(CH_3)(Cp)$, $(COD)Pt(CH_3)Cl$, $(Cp)Pt(CH_3)(CO)$, $(Cp)Pt(allyl)$, $(Cp)Pt(CH_3)_3$, $(MeCp)Pt(CH_3)_3$, $(acac)Pt(CH_3)_3$, $Pt(acac)_2$, $Pt(CH_3)_2(CH_3)NC$, $Pt(HPA)_2$, $Pt(hfac)_2$, $Pt(tmhd)_2$, $Ru(Cp)_2$, $Ru(MeCp)_2$, $Ru(EtCp)_2$, $Ru(tmhd)_3$, $Ru(od)_3$, $(MeCp)Ir(COD)$, $(EtCp)Ir(COD)$, $(Cp)Ir(COD)$, $(hfac)Ir(COD)$, $Ir(acac)_3$, $(acac)Ir(COD)$, $(COD)Ir(\mu\text{-}OAc)$, $(COD)Ir(\mu\text{-}OCH_3)_2$, $Ir(allyl)_3$, iridium halide, $Ir(hfa)_2$, $Ir(hfac)_2$ and $Ir(tmhd)_2$.

14. The method of claim 8, wherein the reaction gas is selected from a group consisting of $O_2$, $H_2$, $NH_3$ and $N_2O$.

15. The method of claim 8, wherein the solvent is selected from a group consisting of tetrahydrofuran(THF), n-butylacetate, hexane, cyclohexane, toluene, xylene and benzene.

* * * * *